(12) United States Patent
Jia et al.

(10) Patent No.: US 12,057,533 B2
(45) Date of Patent: Aug. 6, 2024

(54) LIGHT EMITTING DIODE STRUCTURE

(71) Applicant: LITE-ON OPTO TECHNOLOGY (CHANGZHOU) CO., LTD., Changzhou (CN)

(72) Inventors: Shu-yong Jia, Changzhou (CN); Zhen-Wei Shao, Changzhou (CN); Peng-Fei Li, Baiyin (CN)

(73) Assignee: LITE-ON OPTO TECHNOLOGY (CHANGZHOU) CO., LTD., Changzhou (CN)

( * ) Notice: Subject to any disclaimer, the term of this patent is extended or adjusted under 35 U.S.C. 154(b) by 489 days.

(21) Appl. No.: 17/523,865

(22) Filed: Nov. 10, 2021

(65) Prior Publication Data
US 2022/0199869 A1 Jun. 23, 2022

(30) Foreign Application Priority Data
Dec. 22, 2020 (CN) .......................... 202011530160.9

(51) Int. Cl.
*H01L 33/50* (2010.01)
*H01L 25/075* (2006.01)
*H01L 33/54* (2010.01)
*H01L 33/58* (2010.01)

(52) U.S. Cl.
CPC ............ *H01L 33/507* (2013.01); *H01L 33/54* (2013.01); *H01L 33/58* (2013.01); *H01L 25/0753* (2013.01); *H01L 33/504* (2013.01)

(58) Field of Classification Search
CPC ....... H01L 33/507; H01L 33/54; H01L 33/58; H01L 25/0753; H01L 33/504; H01L 33/501; H01L 33/56; H01L 33/48; H01L 33/50; H01L 2933/0033; H01L 2933/0041
See application file for complete search history.

(56) References Cited

U.S. PATENT DOCUMENTS

| | | | | |
|---|---|---|---|---|
| 8,957,428 | B2 * | 2/2015 | Jagt | H01L 33/44 |
| | | | | 257/E27.012 |
| 8,957,429 | B2 * | 2/2015 | Wang | H01L 33/505 |
| | | | | 257/88 |
| 11,107,949 | B2 * | 8/2021 | Wei | G09G 3/32 |
| 11,380,821 | B2 * | 7/2022 | Jia | H01L 33/486 |
| 2009/0206353 | A1 * | 8/2009 | Okazaki | H01L 33/54 |
| | | | | 257/98 |
| 2009/0236619 | A1 * | 9/2009 | Chakroborty | H01L 33/50 |
| | | | | 257/89 |

(Continued)

*Primary Examiner* — Caleb E Henry
(74) *Attorney, Agent, or Firm* — Li & Cai Intellectual Property Office

(57) ABSTRACT

A light emitting diode structure including a light emitting unit having a blue LED chip to produce a first light beam, a first light conversion layer disposed on the light emitting unit to convert a part of the first light beam into a second light beam, and a second light conversion layer disposed on the first light conversion layer to convert another part of the first light beam into a third light beam is provided. A remaining part of the first light beam, the second light beam, and the third light beam are superposed to form a working light beam whose spectrum includes a first wave band ranging from 350 nm to 660 nm and a second wave band ranging from 660 nm to 1000 nm. A power of the working light beam in the second wave band is higher than that in the first wave band.

21 Claims, 7 Drawing Sheets

(56) References Cited

U.S. PATENT DOCUMENTS

| | | | | |
|---|---|---|---|---|
| 2010/0103648 A1* | 4/2010 | Kim | ...................... | H01L 33/507 |
| | | | | 257/E33.061 |
| 2013/0105854 A1* | 5/2013 | Jang | ......................... | C09C 3/10 |
| | | | | 252/519.2 |
| 2014/0034901 A1* | 2/2014 | Moon | ...................... | H01L 33/04 |
| | | | | 257/13 |
| 2015/0301257 A1* | 10/2015 | Choi | ........................ | F21V 3/049 |
| | | | | 359/885 |
| 2017/0186971 A1* | 6/2017 | Kanamoto | ......... | H10K 85/6572 |
| 2017/0324054 A1* | 11/2017 | Ishisone | ............. | H10K 59/1213 |
| 2018/0074372 A1* | 3/2018 | Takeya | ............. | G02F 1/133514 |
| 2018/0180951 A1* | 6/2018 | Toyotaka | .......... | G02F 1/134336 |
| 2018/0233625 A1* | 8/2018 | Jung | ...................... | H01L 33/60 |
| 2019/0058096 A1* | 2/2019 | Guo | ......................... | H01L 33/46 |
| 2019/0319016 A1* | 10/2019 | Zhang | .................... | H01L 33/505 |
| 2020/0127174 A1* | 4/2020 | Zhong | ................... | H01L 33/504 |
| 2020/0194634 A1* | 6/2020 | Li | ........................... | H01L 33/08 |
| 2020/0303358 A1* | 9/2020 | Zhang | ................. | H01L 25/0753 |
| 2021/0050491 A1* | 2/2021 | Sun | ....................... | H01L 33/502 |

\* cited by examiner

LIGHT EMITTING DIODE STRUCTURE

CROSS-REFERENCE TO RELATED PATENT APPLICATION

This application claims the benefit of priority to China Patent Application No. 202011530160.9, filed on Dec. 22, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an infrared light illumination field, and more particularly to a light emitting diode structure.

BACKGROUND OF THE DISCLOSURE

Generally, infrared light illumination equipment containing infrared light emitting diodes is used in surveillance cameras as an auxiliary light source, and is matched with a specific night vision lens to facilitate continuous video recording in dim light. Since infrared light cannot be observed by naked eyes, using infrared light as the light source can improve how well the surveillance cameras are concealed.

However, a dark red light generated by commercially available infrared lighting equipment can be observed by naked eyes from a short distance, which limits the concealment of the surveillance cameras. Moreover, when the infrared lighting equipment is used to provide fill lights for taking photos, even if the infrared lighting equipment is used in cooperation with a matching night vision lens, the photos thus produced can still turn out to be black and white and be unable to reflect the actual color of objects in the photo.

Therefore, there is still room for improvement in the application of infrared light emitting diodes in infrared light illumination equipment.

SUMMARY OF THE DISCLOSURE

In response to the above-referenced technical inadequacies, the present disclosure provides a light emitting diode structure.

In one aspect, the present disclosure provides a light emitting diode structure. The light emitting diode (LED) structure includes a light emitting unit, a first light conversion layer, and a second light conversion layer. The light emitting unit includes a blue LED chip to generate a first light beam. The first light conversion layer is disposed on the light emitting unit to convert a part of the first light beam into a second light beam. The second light conversion layer is disposed on the first light conversion layer to convert another part of the first light beam into a third light beam. A remaining part of the first light beam, the second light beam, and the third light beam are superposed to form a working light beam. A spectrum of the working light beam includes a first wave band ranging from 350 nm to 660 nm and a second wave band ranging from 660 nm to 1000 nm. A power of the working light beam in the second wave band is higher than the power of the working light beam in the first wave band.

In another aspect, the present disclosure provides a method for manufacturing a light emitting diode structure. The method for manufacturing the light emitting diode structure includes steps of: providing a light emitting unit including a blue LED chip to generate a first light beam; disposing a first light conversion layer and a second light conversion layer on the light emitting unit. The first light conversion layer is disposed between the second light conversion layer and the light emitting unit. A part of the first light beam is converted into a second light beam through the first light conversion layer. Another part of the first light beam is converted into a third light beam through the second light conversion layer. A remaining part of the first light beam, the second light beam, and the third light beam are superposed to form a working light beam. A spectrum of the working light beam includes a first wave band ranging from 350 nm to 660 nm and a second wave band ranging from 660 nm to 1000 nm. A power of the working light beam in the second wave band is higher than that in the first wave band.

In certain embodiments, a ratio of the power of the working light beam in the first wave band to the power of the working light beam in the second wave band is larger than 10%.

In certain embodiments, a color temperature of the working light beam ranges from 2000 K to 3800 K.

In certain embodiments, the first light conversion layer contains a near infrared light phosphor, and the near infrared light phosphor is selected from the group consisting of: (Y, Lu, Gd)$_3$(Ga, Al, Sc)$_5$O$_{12}$:Cr, (Y, Lu, Gd)$_3$(Ga, Al, Sc)$_5$O$_{12}$:Yb, (Li, Na, K)(B, Ga, Al)$_5$(Mg, Ca, Sr, Ba, Zn)O$_8$:Cr, (Li, Na, K, Rb, Cs, NH$_4$)$_3$(Al, Ga)F$_6$:Cr, and (Sc)BO$_3$:Cr.

In certain embodiments, a fluorescence emission spectrum of the near infrared light phosphor has a peak between 700 nm and 1800 nm.

In certain embodiments, based on a total weight of a light-transmissive resin of the first light conversion layer being 100 phr, the first light conversion layer contains 200 phr to 400 phr of a near infrared light phosphor.

In certain embodiments, based on a total weight of a light-transmissive resin of the first light conversion layer being 100 phr, the first light conversion layer contains 1 phr to 10 phr of a red phosphor.

In certain embodiments, the second light conversion layer contains a visible light phosphor, and the visible light phosphor is selected from the group consisting of: (Y, Lu, Gd, Tb)$_3$(Ga, Al)$_5$O$_{12}$:Ce, (La, Y)$_3$Si$_6$N$_{11}$:Ce, (Sr, Ba, Mg)$_2$SiO$_4$:Eu, (Ba, Ca, Sr)Si$_2$O$_2$N$_2$:Eu, α-SiAlON:Eu, β-SiAlON:Eu, (Sr, Ca)$_2$Si$_5$N$_8$:Eu, NaCa$_2$Al$_{13}$O$_{22}$:Eu, K$_6$Ba$_4$B$_8$O$_{19}$:Eu, Ba$_5$B$_4$O$_{10}$F$_2$:Eu, and (Sr, Ca)AlSiN$_3$:Eu.

In certain embodiments, based on a total weight of a light-transmissive resin of the second light conversion layer being 100 phr, the second light conversion layer contains 5 phr to 70 phr of a visible light phosphor.

In certain embodiments, the second light conversion layer contains a visible light phosphor, and the visible light phosphor includes a red phosphor and a yellow phosphor.

In certain embodiments, based on the total weight of the light-transmissive resin of the second light conversion layer being 100 phr, the second light conversion layer contains 5 phr to 60 phr of the yellow phosphor and 1 phr to 10 phr of the red phosphor.

In certain embodiments, a red phosphor layer is disposed between the blue LED chip and the first light conversion layer.

In certain embodiments, the red phosphor layer contains a red phosphor selected from the group consisting of $(Sr, Ca)AlSiN_3$:Eu, $(Sr, Ca)_2Si_5N_8$:Eu, $NaCa_2Al_{13}O_{22}$:Eu, $K_6Ba_4B_8O_{19}$:Eu, and $Ba_5B_4O_{10}F_2$:Eu.

In certain embodiments, based on a total weight of a light-transmissive resin of the red phosphor layer being 100 phr, the red phosphor layer contains 1 phr to 50 phr of a red phosphor.

In certain embodiments, the light emitting unit includes a red LED chip, and a red light beam generated by the red LED chip and a blue light beam generated by the blue LED chip are superposed to form the first light beam.

In certain embodiments, the light emitting diode structure further includes a light-transmissive layer, and a material of the light-transmissive layer includes a silicone-based composition, an epoxy composition, or a mixture thereof.

In certain embodiments, the light-transmissive layer is disposed between the light emitting unit and the first light conversion layer.

In certain embodiments, a refractive index of the light-transmissive layer is higher than or equal to a refractive index of the first light conversion layer, and the refractive index of the first light conversion layer is higher than or equal to a refractive index of the second light conversion layer.

In certain embodiments, the light-transmissive layer is disposed between the first light conversion layer and the second light conversion layer.

In certain embodiments, a refractive index of the first light conversion layer is higher than or equal to a refractive index of the light-transmissive layer, and the refractive index of the light-transmissive layer is higher than or equal to a refractive index of the second light conversion layer.

In certain embodiments, a refractive index of the first light conversion layer is higher than or equal to a refractive index of the second light conversion layer.

Therefore, by virtue of "a first light conversion layer to convert a part of the first light beam into a second light beam" and "a second light conversion layer to convert another part of the first light beam into a third light beam", the light emitting diode structure of the present disclosure can have properties required in application.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
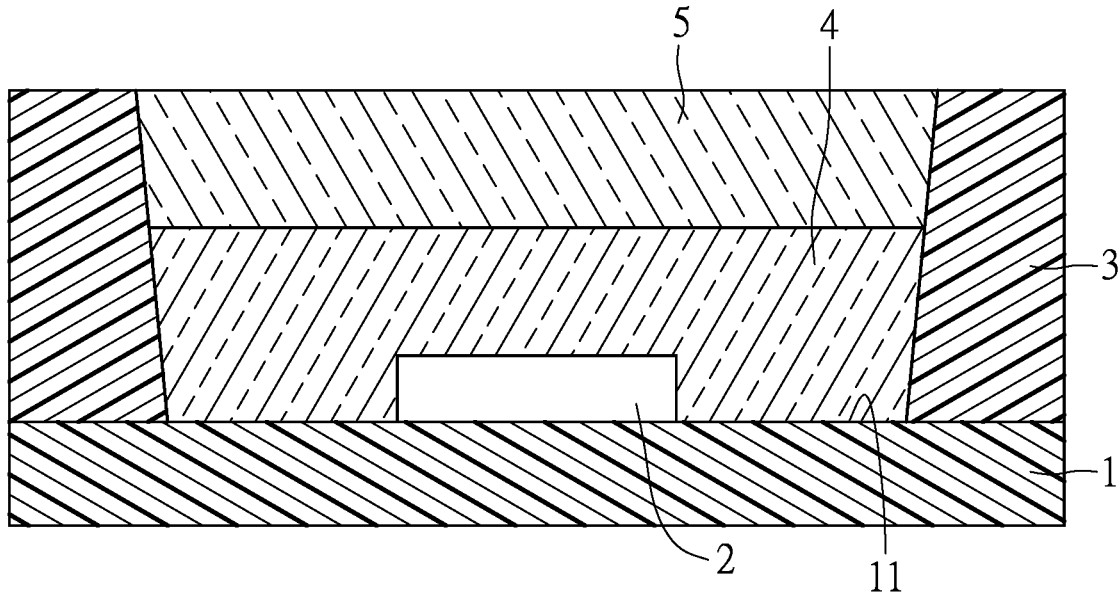
FIG. 1 is a schematic cross-sectional view of a light emitting diode structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The light emitting diode structure of the present disclosure can generate a near infrared light beam and a visible light beam simultaneously. When the light emitting diode structure is used as a light source of lighting equipment, the light emitting diode structure does not generate a red light beam that is obviously observable to naked eyes. Moreover, an appropriate amount of the visible light beam can be used as a fill light so that actual colors of objects can be presented even in dim light. Accordingly, the light emitting diode structure of the present disclosure can have properties as required by a surveillance camera or other infrared light lighting devices.

According to FIG. 1, the light emitting diode structure of the present disclosure includes: a substrate unit 1, a light emitting unit 2, a reflective unit 3, a first light conversion layer 4, and a second light conversion layer 5.

The substrate unit 1 has a mounting surface 11.

The light emitting unit 2 is disposed on the mounting surface 11 of the substrate unit 1. The light emitting unit 2 at least includes a blue LED chip to enhance a light efficiency of the light emitting diode structure. For example, the light emitting unit 2 can be a single blue LED chip, a combination of the blue LED chip and a red LED chip, or a white LED chip. However, the present disclosure is not limited thereto.

The light emitting unit 2 is used to generate a first light beam. The first light beam can be a blue light beam or a mixed light superposed from the blue light beam with light beams of other colors, thereby facilitating the first light beam to be converted by the first light conversion layer 4 and the second light conversion layer 5 respectively into a second light beam and a third light beam. In other words, a spectrum of the first light beam at least includes a peak between 400 nm and 500 nm.

The reflective unit 3 is disposed on the mounting surface 11 of the substrate unit 1. The reflective unit 3 and the substrate unit 1 constitute an accommodating space. The light emitting unit 2, the first light conversion layer 4, and the second light conversion layer 5 are disposed in the accommodating space.

The reflective unit 3 surrounds the light emitting unit 2. The first light beam generated by the light emitting unit 2 can be reflected by the reflective unit 3 for convergence of light. Further, the reflective unit 3 also surrounds the first light conversion layer 4 and the second light conversion layer 5, and contacts the first light conversion layer 4 and the second light conversion layer 5. The reflective unit 3 can reflect the second light beam and the third light beam for convergence of light.

The first light conversion layer 4 is disposed on the light emitting unit 2. The mounting surface 11 of the substrate unit 1 and the light emitting unit 2 are completely covered by the first light conversion layer 4. Therefore, the light emitting unit 2 is not exposed from the first light conversion layer 4. The first light conversion layer 4 is a light-transmissive layer. A material of the first light conversion layer 4 includes a light-transmissive resin, such as a silicone-based resin, an epoxy resin, or a combination thereof.

A part of the first light beam can be converted into the second light beam by the first light conversion layer 4. The first light conversion layer 4 at least contains a near infrared light phosphor. When the first light beam passes through the first light conversion layer 4, a part of the first light beam is converted into the second light beam by the near infrared light phosphor. The second light beam includes a near infrared light beam. In other words, a spectrum of the second light beam at least includes a peak ranging between 660 nm and 1000 nm.

Specifically, the near infrared light phosphor is selected from the group consisting of: $(Y, Lu, Gd)_3(Ga, Al, Sc)_5O_{12}$:Cr, $(Y, Lu, Gd)_3(Ga, Al, Sc)_5O_{12}$:Yb, $(Li, Na, K)(B, Ga, Al)_5(Mg, Ca, Sr, Ba, Zn)O_8$:Cr, $(Li, Na, K, Rb, Cs, NH_4)_3(Al, Ga)F_6$:Cr, and $(Sc)BO_3$:Cr. However, the present disclosure is not limited thereto. In a preferable embodiment, the near infrared light phosphor is $Y_3Al_5O_{12}$:Cr whose fluorescence emission spectrum includes a peak ranging between 700 nm and 1800 nm. Based on a total weight of the light-transmissive resin of the first light conversion layer 4 being 100 phr, the first light conversion layer 4 contains 200 phr to 400 phr of the near infrared light phosphor.

The second light conversion layer 5 is disposed on the first light conversion layer 4, and the first light conversion layer 4 is completely covered by the second light conversion layer 5. A top end of the second light conversion layer 5 can be flush with a top end of the reflective unit 3. In other embodiments, a top surface of the second light conversion layer 5 can be in a shape of concave or convex. The second light conversion layer 5 is a light-transmissive layer. A material of the second light conversion layer 5 includes a light-transmissive resin, such as a silicone-based resin, an epoxy resin, or a combination thereof.

Another part of the first light beam can be converted into the third light beam by the second light conversion layer 5. The second light conversion layer 5 at least contains a visible light phosphor. When the first light beam passes through the second light conversion layer 5, the another part of the first light beam is converted into the third light beam by the visible light phosphor. The third light beam is a visible light beam. In other words, a spectrum of the third light beam at least includes a peak ranging between 350 nm and 660 nm.

Specifically, the visible light phosphor is selected from the group consisting of: $(Y, Lu, Gd, Tb)_3(Ga, Al)_5O_{12}$:Ce, $(La, Y)_3Si_6N_{11}$:Ce, $(Sr, Ba, Mg)_2SiO_4$:Eu, $(Ba, Ca, Sr)Si_2O_2N_2$:Eu, $\alpha$-SiAlON:Eu, $\beta$-SiAlON:Eu, $(Sr, Ca)_2Si_5N_8$:Eu, $NaCa_2Al_{13}O_{22}$:Eu, $K_6Ba_4B_8O_{19}$:Eu, $Ba_5B_4O_{10}F_2$:Eu, and $(Sr, Ca)AlSiN_3$:Eu. However, the present disclosure is not limited thereto.

In some embodiments, based on a total weight of the light-transmissive resin of the second light conversion layer 5 being 100 phr, the second light conversion layer 5 contains 5 phr to 70 phr of the visible light phosphor. In a preferable embodiment, the visible light phosphor can include only a yellow phosphor or a combination of the yellow phosphor with a red light phosphor. In another preferable embodiment, based on a total weight of the light-transmissive resin of the second light conversion layer 5 being 100 phr, the second light conversion layer 5 contains 5 phr to 60 phr of the yellow phosphor and 1 phr to 10 phr of the red phosphor.

When the first light beam passes through the first light conversion layer 4 and the second light conversion layer 5, the second light beam and the third light beam can be respectively generated. The remaining (unconverted) part of the first light beam, the second light beam, and the third light beam are superposed to form a working light beam. In practice, the working light beam is a light beam generated by the light emitting diode structure to the external environment.

It should be noted that the first light conversion layer 4 and the second light conversion layer 5 can contain more than one kind of phosphor. In other words, in addition to the near infrared light phosphor, the first light conversion layer 4 can further contain a visible light phosphor, such as a red phosphor. For example, the red phosphor can be selected from the group consisting of: $(Sr, Ca)AlSiN_3$:Eu, $(Sr, Ca)_2Si_5N_8$:Eu, $NaCa_2Al_{13}O_{22}$:Eu, $K_6Ba_4B_8O_{19}$:Eu, and $Ba_5B_4O_{10}F_2$:Eu. However, the present disclosure is not limited thereto. Based on the total weight of the light-transmissive resin of the first light conversion layer 4 being 100 phr, the first light conversion layer 4 can contain 1 phr to 10 phr of the red phosphor.

Similarly, in addition to the visible light phosphor, the second light conversion layer 5 can further contain a near infrared light phosphor. Accordingly, not only the first light beam but also the second light beam can be partially converted into the third light beam by the second light conversion layer 5. However, the example illustrated above is only one of the available embodiments and should not be taken as limiting the scope of the present disclosure.

In some embodiments, a refractive index of the first light conversion layer 4 and a refractive index of the second light conversion layer 5 are higher than or equal to the refractive index of air. The refractive index of the first light conversion layer 4 and the refractive index of the second light conversion layer 5 can be the same or different. When the first light conversion layer 4 and the second light conversion layer 5 have different refractive indexes, preferably, the refractive index of the first light conversion layer 4 is higher than the refractive index of the second light conversion layer 5.

First Embodiment

Referring to FIG. 1, a first embodiment of the present disclosure provides a light emitting diode structure. The light emitting diode structure includes the substrate unit 1, the light emitting unit 2, the reflective unit 3, the first light conversion layer 4, and the second light conversion layer 5.

In the first embodiment, the light emitting unit 2 includes the blue LED chip. The light emitting unit 2 is used to generate the first light beam. Therefore, the first light beam includes the blue light beam. The first light conversion layer 4 contains the near infrared light phosphor. The second light conversion layer 5 contains the yellow phosphor and the red phosphor. A part of the first light beam is converted into the second light beam by the first light conversion layer 4. Another part of the first light beam is converted into the third light beam by the second light conversion layer 5. Then, the remaining part of the first light beam, the second light beam, and the third light beam are superposed to form the working light beam.

Second Embodiment

Figure 2:
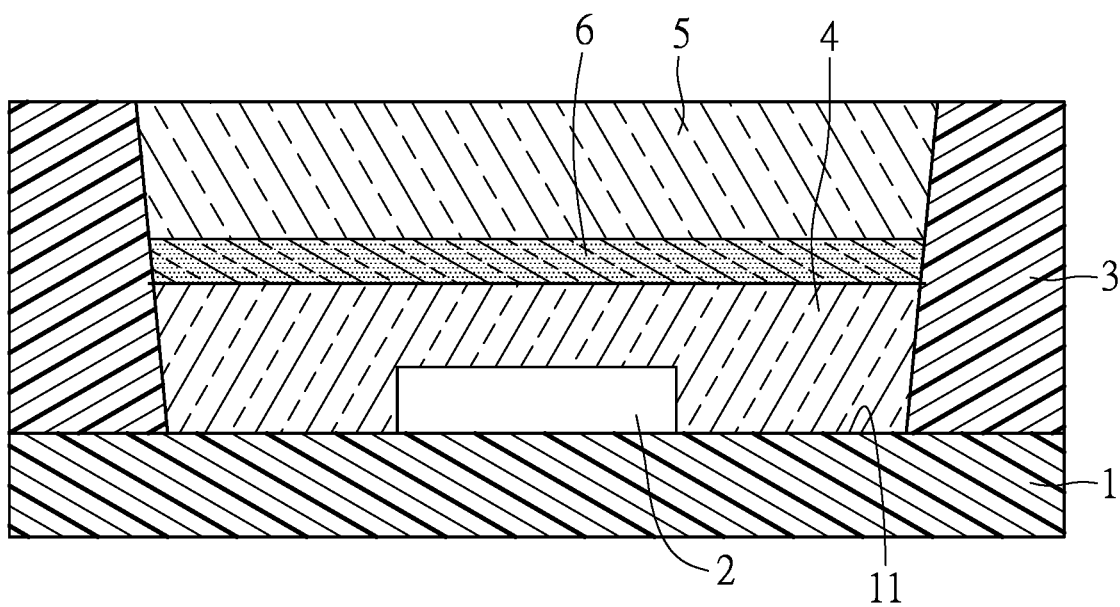
FIG. 2 is a schematic cross-sectional view of the light emitting diode structure according to a second embodiment of the present disclosure.

Referring to FIG. 2, a second embodiment of the present disclosure provides a light emitting diode structure which is similar to the light emitting diode structure of the first embodiment. The difference is that the light emitting diode structure of the second embodiment further includes a light-transmissive layer 6.

The light-transmissive layer 6 is disposed between the first light conversion layer 4 and the second light conversion layer 5. The light-transmissive layer 6 has an effect of convergence of light beams so that light efficiencies of the first light beam and the second light beam can be enhanced. Specifically, a material of the light-transmissive layer 6 includes a silicone-based composition, an epoxy composition, or a mixture thereof.

A refractive index of the light-transmissive layer 6 can be the same or different from the refractive index of the first light conversion layer 4 or the refractive index of the second light conversion layer 5. In some embodiments, the refractive index of the first light conversion layer 4 is higher than or equal to the refractive index of the light-transmissive layer 6, and the refractive index of the light-transmissive layer 6 is higher than or equal to the refractive index of the second light conversion layer 5.

Third Embodiment

Figure 3:
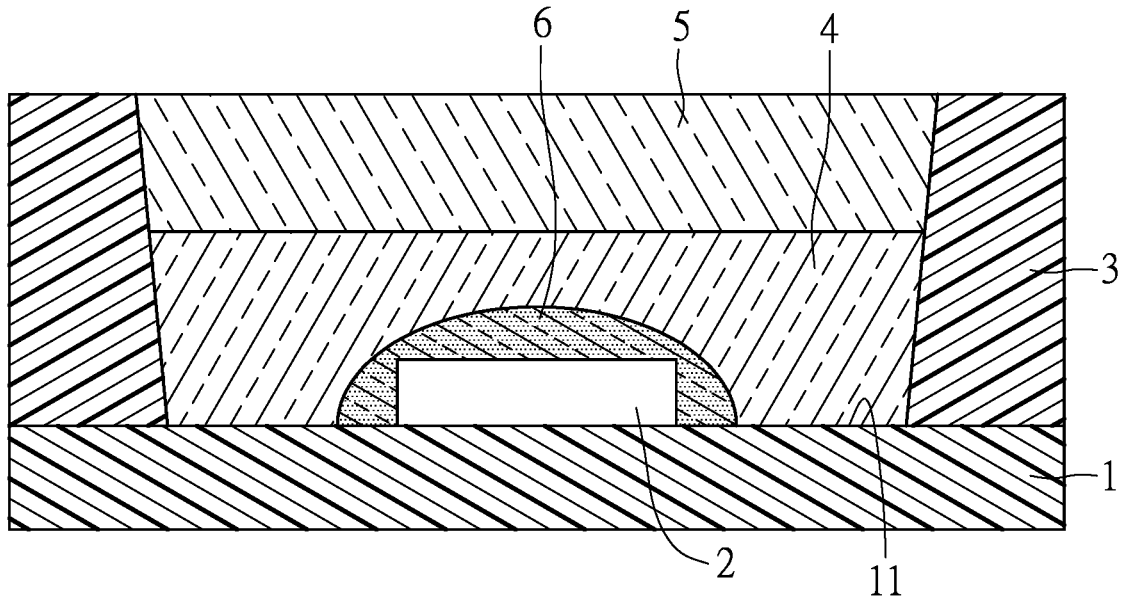
FIG. 3 is a schematic cross-sectional view of the light emitting diode structure according to a third embodiment of the present disclosure.

Referring to FIG. 3, a third embodiment of the present disclosure provides a light emitting diode structure which is similar to the light emitting diode structure of the second embodiment. The difference is that the light-transmissive layer 6 is disposed between the light emitting unit 2 and the first light conversion layer 4, and the light emitting unit 2 is completely covered by the light-transmissive layer 6. The light-transmissive layer 6 has an effect of convergence of light beams so that a light efficiency of the first light beam can be enhanced.

In some embodiments, the refractive index of the light-transmissive layer 6 is higher than or equal to the refractive index of the first light conversion layer 4, and the refractive index of the first light conversion layer 4 is higher than or equal to the refractive index of the second light conversion layer 5.

In other embodiments, the light emitting diode structure can include a first light-transmissive layer and a second light-transmissive layer. The first light-transmissive layer is disposed between the light emitting unit 2 and the first light conversion layer 4. The light emitting unit 2 is completely covered by the first light-transmissive layer. The second light-transmissive layer is disposed between the first light conversion layer 4 and the second light conversion layer 5. A refractive index of the first light-transmissive layer is higher than or equal to the refractive index of the first light conversion layer 4. A refractive index of the second light-transmissive layer is higher than or equal to the refractive index of the second light conversion layer 5. However, the present disclosure is not limited to that disclosed herein.

Fourth Embodiment

Figure 4:
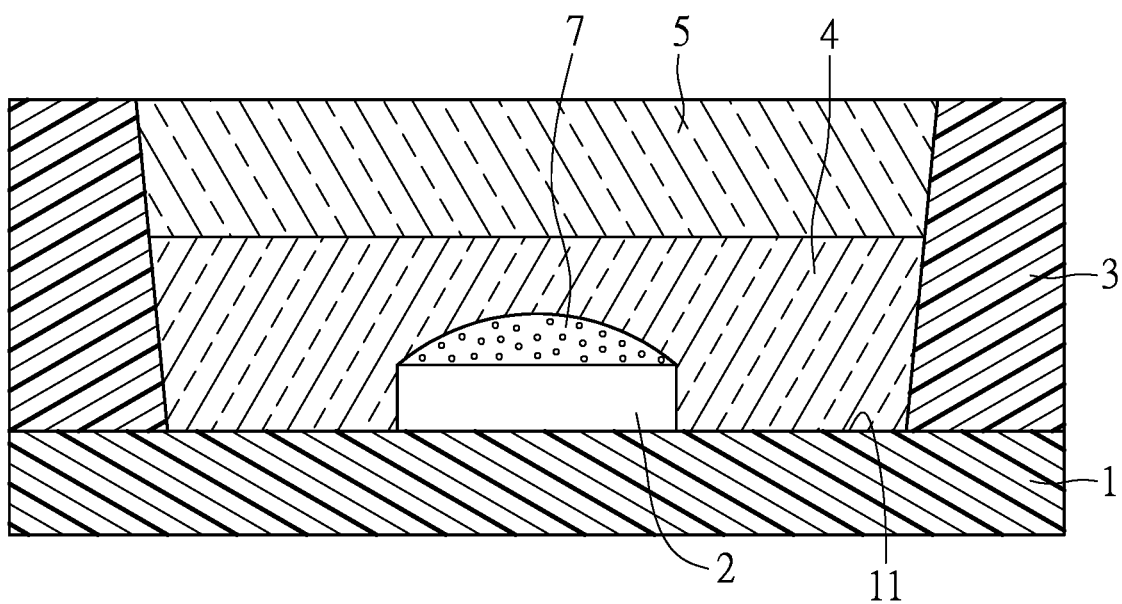
FIG. 4 is a schematic cross-sectional view of the light emitting diode structure according to a fourth embodiment of the present disclosure.

Referring to FIG. 4, a fourth embodiment of the present disclosure provides a light emitting diode structure which is similar to the light emitting diode structure of the first embodiment. The difference is that the light emitting diode structure further includes a red phosphor layer 7, and the second light conversion layer 5 contains only the yellow phosphor.

The red phosphor layer 7 is a light-transmissive layer. A main material of the red phosphor layer 7 includes a light-transmissive resin, such as a silicone-based resin, an epoxy resin, or a combination thereof. The red phosphor layer 7 is disposed between the light emitting unit 2 and the first light conversion layer 4. A light output surface of the light emitting unit 2 is covered by the red phosphor layer 7. The red phosphor layer 7 at least contains a red phosphor. When the first light beam passes through the red phosphor layer 7, a part of the first light beam can be converted into a red light beam by the red phosphor layer 7. A spectrum of the red light beam at least includes a peak between 550 nm and 750 nm.

Specifically, the red phosphor is selected from the group consisting of (Sr, Ca)AlSiN$_3$:Eu, (Sr, Ca)$_2$Si$_5$N$_8$:Eu, NaCa$_2$Al$_{13}$O$_{22}$:Eu, K$_6$Ba$_4$B$_8$O$_{19}$:Eu, and Ba$_5$B$_4$O$_{10}$F$_2$:Eu. Based on the total weight of the light-transmissive resin of the red phosphor layer 7 being 100 phr, the red phosphor layer 7 contains 1 phr to 50 phr of the red phosphor.

In the fourth embodiment, a part of the first light beam can be converted into the red light beam by the red phosphor layer 7. When the red light beam passes through the first light conversion layer 4, a part of the red light beam can be converted into the second light beam. Compared to the blue light beam, the red light beam has a higher light conversion efficiency when converted by the first light conversion layer 4. In addition, the unconverted red light beam can contribute to a red light wave band of the visible light beam so that a light efficiency to the visible light beam can be enhanced.

In some embodiments, a refractive index of the red phosphor layer 7 is higher than or equal to the refractive index of the first light conversion layer 4, and the refractive index of the first light conversion layer 4 is higher than or equal to the refractive index of the second light conversion layer 5.

Fifth Embodiment

Figure 5:
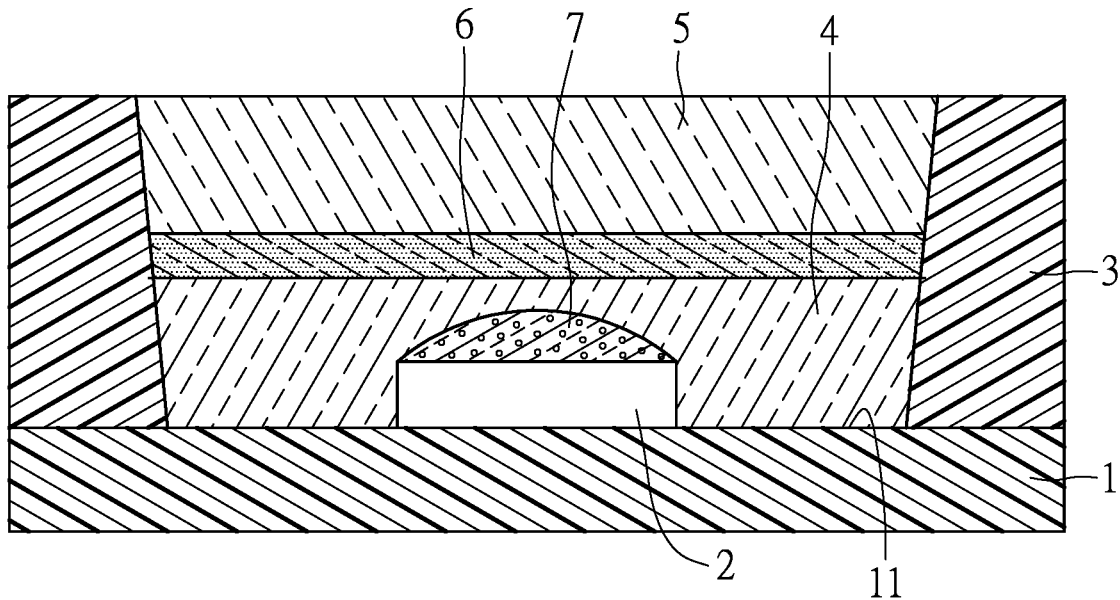
FIG. 5 is a schematic cross-sectional view of a light emitting diode structure according to a fifth embodiment of the present disclosure.

Referring to FIG. 5, a fifth embodiment of the present disclosure provides a light emitting diode structure which is similar to the light emitting diode structure of the fourth embodiment. The difference is that the light emitting diode structure further includes the light-transmissive layer 6.

The light-transmissive layer 6 in the fifth embodiment is similar to the light-transmissive layer 6 in the second embodiment, and the light-transmissive layer 6 is disposed between the first light conversion layer 4 and the second light conversion layer 5. The specific structure of the light-transmissive layer 6 is not reiterated herein.

In some embodiments, the refractive index of the red phosphor layer 7 is higher than or equal to the refractive index of the first light conversion layer 4, the refractive index of the first light conversion layer 4 is higher than or equal to the refractive index of the light-transmissive layer 6, and the refractive index of the light-transmissive layer 6 is higher than or equal to the refractive index of the second light conversion layer 5.

In other embodiments, the light-transmissive layer 6 can be disposed between the light emitting unit 2 and the first light conversion layer 4. The refractive index of the red phosphor layer 7 is higher than or equal to the refractive index of the light-transmissive layer 6, the refractive index of the light-transmissive layer 6 is higher than or equal to the refractive index of the first light conversion layer 4, and the refractive index of the first light conversion layer 4 is higher than or equal to the refractive index of the second light conversion layer 5.

Sixth Embodiment

Figure 6:
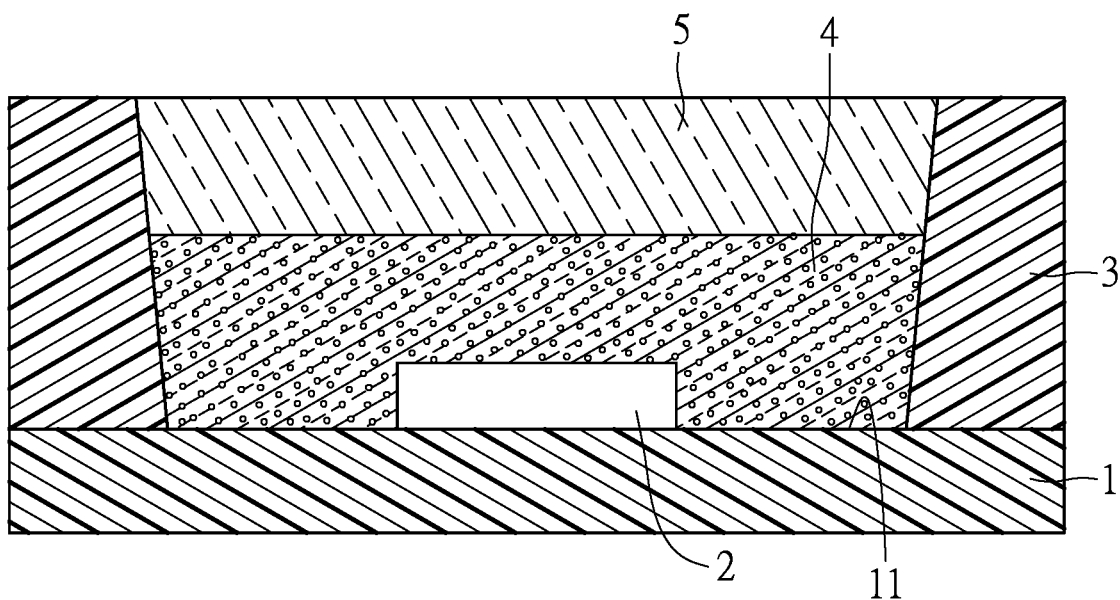
FIG. 6 is a schematic cross-sectional view of the light emitting diode structure according to a sixth embodiment of the present disclosure.

Referring to FIG. 6, a sixth embodiment of the present disclosure provides a light emitting diode structure which is similar to the light emitting diode structure of the second embodiment. The difference is that the first light conversion layer 4 further includes the red phosphor, and the second light conversion layer 5 only includes the yellow phosphor.

In the sixth embodiment, the first light conversion layer 4 contains the near infrared light phosphor and the red phosphor. When the first light beam passes through the first light conversion layer 4, a part of the first light beam can be converted into the second light beam and another part of the first light beam can be converted into a red light beam. In addition, when the red light beam passes through the first light conversion layer 4, a part of the red light beam can also be converted into the second light beam. The unconverted red light beam can contribute to a red light wave band of the visible light beam so that a light efficiency of the visible light beam can be enhanced.

The specific examples of the near infrared light phosphor and the red phosphor are similar to that of previous embodiments and are not reiterated herein. In some embodiments, the first light conversion layer 4 can contain 200 phr to 400 phr of the near infrared light phosphor and 1 phr to 10 phr of the red phosphor.

Seventh Embodiment

Figure 7:
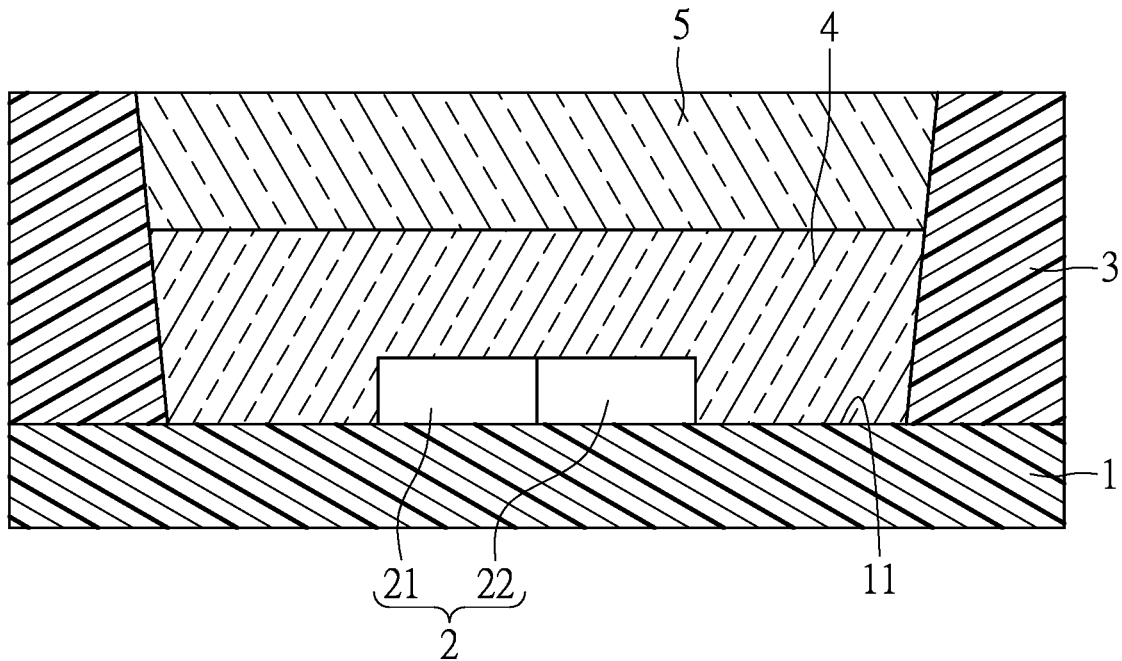
FIG. 7 is a schematic cross-sectional view of the light emitting diode structure according to a seventh embodiment of the present disclosure.

Referring to FIG. 7, a seventh embodiment of the present disclosure provides a light emitting diode structure which is similar to the light emitting diode structure of the first embodiment. The difference is that the light emitting unit 2 further includes a red LED chip 22.

The red LED chip 22 and the blue LED chip 21 are disposed abreast on the mounting surface 11. The blue LED chip 21 and the red LED chip 22 respectively generate a blue light beam and a red light beam. The blue light beam and the red light beam are superposed to form the first light beam.

In the seventh embodiment, when the blue light beam passes through the first light conversion layer 4, a part of the blue light beam is converted into the second light beam. When the blue light beam passes through the second light conversion layer 5, another part of the blue light beam is converted into the third light beam. When the red light beam passes through the first light conversion layer 4, a part of the red light beam is converted into the second light beam. Compared to the blue light beam, the red light beam has a higher light conversion efficiency when converted by the first light conversion layer 4. In addition, the unconverted red light beam can contribute to a red light wave band of the visible light beam so that a light efficiency of the visible light beam can be enhanced.

Eighth Embodiment

Figure 8:
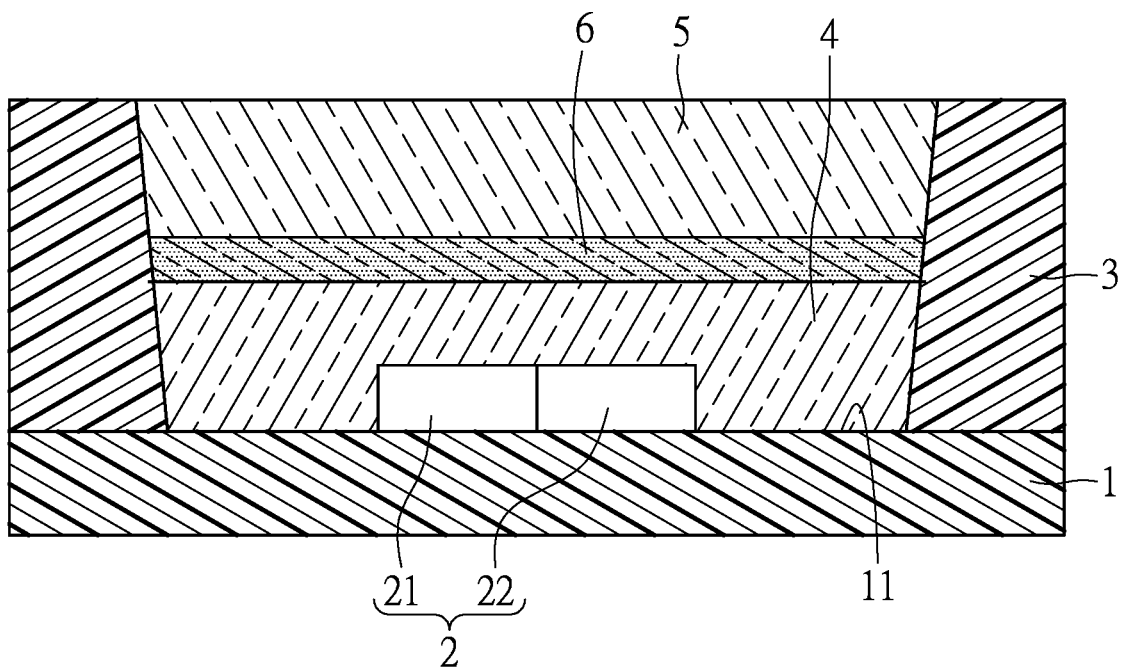
FIG. 8 is a schematic cross-sectional view of the light emitting diode structure according to an eighth embodiment of the present disclosure.

Referring to FIG. 8, an eighth embodiment of the present disclosure provides a light emitting diode structure which is similar to the light emitting diode structure of the seventh embodiment. The difference is that the light emitting diode structure further includes the light-transmissive layer 6.

The light-transmissive layer 6 of the eighth embodiment is similar to the light-transmissive layer 6 of the second embodiment, and the light-transmissive layer 6 is disposed between the first light conversion layer 4 and the second light conversion layer 5. The specific structure of the light-transmissive layer 6 is not reiterated herein.

Ninth Embodiment

Figure 9:
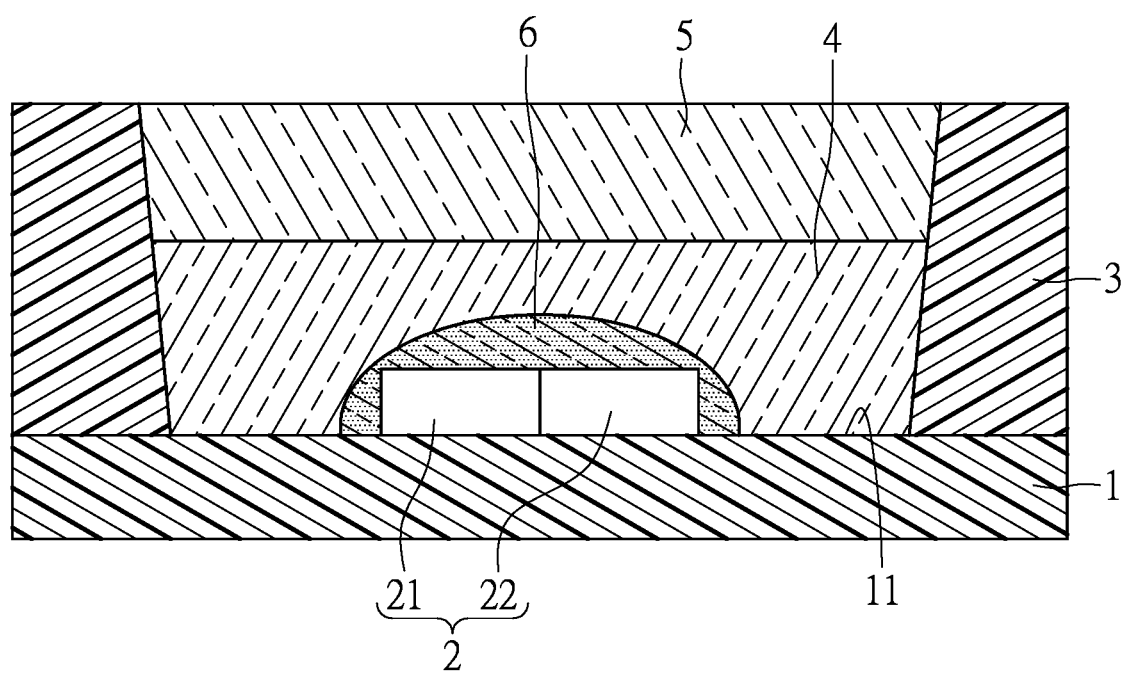
FIG. 9 is a schematic cross-sectional view of the light emitting diode structure according to a ninth embodiment of the present disclosure.

Referring to FIG. 9, a ninth embodiment of the present disclosure provides a light emitting diode structure which is similar to the light emitting diode structure of the seventh embodiment. The difference is that the light emitting diode structure further includes the light-transmissive layer 6.

The light-transmissive layer 6 of the ninth embodiment is similar to the light-transmissive layer 6 of the third embodiment. The light-transmissive layer 6 is disposed between the light emitting unit 2 and the first light conversion layer 4, and the light emitting unit 2 is completely covered by the light-transmissive layer 6. The specific structure of the light-transmissive layer 6 is not reiterated herein.

Light Efficiency Test of Light Emitting Diode Structure

To prove that the light emitting diode structure of the present disclosure can generate a near infrared light beam and a visible light beam simultaneously, the light emitting diode structures of Examples 1 to 9 are prepared. Structures of the light emitting diode structures of Examples 1 to 9 sequentially and respectively correspond to the light emitting diode structures described in the first embodiment to the ninth embodiment. Materials and amounts of the first light conversion layer, the second light conversion layer, the light-transmissive layer, and the red phosphor layer in each of Examples 1 to 9 are listed in Table 1. Unless otherwise indicated, all units mentioned in Table 1 are parts per weight.

A light-transmissive material used to form the first light conversion layer includes the light-transmissive resin, the near infrared light phosphor (NIR phosphor), and the red phosphor (R phosphor). The amounts of the near infrared light phosphor and the red phosphor are based on the total weight of the light-transmissive resin of the first light conversion layer being 100 phr. After the light-transmissive material is prepared, an appropriate amount of the light-transmissive material is disposed onto the substrate unit by dispensing. The specific amounts of the light-transmissive material used to form the first light conversion layer are listed in Table 1.

A light-transmissive material used to form the second light conversion layer includes the light-transmissive resin, the yellow phosphor (Y phosphor), and the red phosphor. The amounts of the yellow phosphor and the red phosphor are based on the total weight of the light-transmissive resin of the second light conversion layer being 100 phr. After the light-transmissive material is prepared, an appropriate amount of the light-transmissive material is disposed onto the substrate unit by dispensing. The specific amounts of the light-transmissive material used to form the second light conversion layer are listed in Table 1.

A light-transmissive material used to form the light-transmissive layer includes the light-transmissive resin, and the specific amounts of the light-transmissive resin are listed in Table 1.

A light-transmissive material used to form the red phosphor layer includes the light-transmissive resin and the red phosphor. The amount of the red phosphor is based on the total weight of the light-transmissive resin of the red phosphor layer being 100 phr. After the light-transmissive material is prepared, an appropriate amount of the light-transmissive material is disposed onto the substrate unit by dispensing. The specific amounts of the light-transmissive material used to form the red phosphor layer are listed in Table 1.

TABLE 1

| Example | First light conversion layer | | | Second light conversion layer | | | Light-transmissive layer | Red phosphor layer | |
|---|---|---|---|---|---|---|---|---|---|
| | NIR phosphor (phr) | R phosphor (phr) | Weight (mg) | Y phosphor (phr) | R phosphor (phr) | Weight (mg) | Weight (mg) | R phosphor (phr) | Get weight (mg) |
| 1 | 240 | 0 | 22 | 40 | 3 | 10 | / | / | / |
| 2 | 240 | 0 | 22 | 40 | 3 | 10 | 4 | / | / |
| 3 | 240 | 0 | 22 | 40 | 3 | 10 | 4 | / | / |
| 4 | 240 | 0 | 20 | 40 | 0 | 10 | / | 50 | 1 |
| 5 | 240 | 0 | 20 | 40 | 0 | 10 | 4 | 50 | 1 |
| 6 | 240 | 10 | 20 | 40 | 0 | 10 | / | / | / |
| 7 | 240 | 0 | 22 | 40 | 0 | 10 | / | / | / |
| 8 | 240 | 0 | 22 | 40 | 0 | 10 | 4 | / | / |
| 9 | 240 | 0 | 22 | 40 | 0 | 10 | 4 | / | / |

The working light beams generated by the light emitting diode structure in each of Examples 1 to 9 are analyzed, and the analysis results are listed in Table 2.

In Table 2, a first wave band corresponds to a visible light wave band that ranges from 350 nm to 660 nm. A second wave band corresponds to a near infrared light wave band that ranges from 660 nm to 1000 nm. Therefore, the term "luminous flux of the first wave band" indicates a total luminous flux of the working light beam in the visible light wave band, and the term "luminous flux of the second wave band" indicates a total luminous flux of the working light beam in the near infrared light wave band. The term "power of the first wave band" indicates a power of the working light beam in the visible light wave band, and the term "power of the second wave band" indicates a power of the working light beam in the near infrared light wave band. In addition, the term "ratio of power" indicates a ratio of the power of the working light beam in the visible light wave band to the power of the working light beam in the near infrared light wave band.

TABLE 2

| Example | Forward current (mA) | Color coordinate X | Color coordinate Y | Color temperature (K) | Luminous flux (lm) First wave band | Luminous flux (lm) Second wave band | Power (mW) First wave band | Power (mW) Second wave band | Ratio of power |
|---|---|---|---|---|---|---|---|---|---|
| 1 | 700 | 0.43 | 0.40 | 3164 | 25.7 | 0.53 | 68.3 | 532.9 | 12.8% |
| 2 | 700 | 0.43 | 0.41 | 3075 | 26.1 | 0.54 | 70.4 | 548.6 | 12.8% |
| 3 | 700 | 0.41 | 0.39 | 3415 | 24.4 | 0.52 | 67.2 | 583.7 | 11.5% |
| 4 | 700 | 0.40 | 0.39 | 3631 | 45.4 | 0.61 | 119.6 | 552.8 | 21.6% |

TABLE 2-continued

| Example | Forward current (mA) | Color coordinate X | Color coordinate Y | Color temperature (K) | Luminous flux (lm) First wave band | Luminous flux (lm) Second wave band | Power (mW) First wave band | Power (mW) Second wave band | Ratio of power |
|---|---|---|---|---|---|---|---|---|---|
| 5 | 700 | 0.40 | 0.40 | 3528 | 43.9 | 0.5 | 115.5 | 563.3 | 20.5% |
| 6 | 700 | 0.39 | 0.38 | 3791 | 41.0 | 0.45 | 111.2 | 521.4 | 21.3% |
| 7 | 100 | 0.45 | 0.39 | 2698 | 2.2 | 0.01 | 4.7 | 34.1 | 13.7% |
| 8 | 100 | 0.45 | 0.39 | 2641 | 2.6 | 0.01 | 5.9 | 38.3 | 15.4% |
| 9 | 100 | 0.44 | 0.39 | 2632 | 2.9 | 0.01 | 6.4 | 42.4 | 15.1% |

According to results of Table 2, the light emitting diode structure can generate the working light beam having a color temperature ranging from 2000K to 3800K. Preferably, the light emitting diode structure can generate the working light beam having a color temperature ranging from 2500K to 3700K. In other words, the light emitting diode structure of the present disclosure can generate a warm white working light beam.

According to results of Table 2, the power of the working light beam in the second wave band is higher than the power of the working light beam in the first wave band. Specifically, in the working light beam, a ratio of the visible light beam to the near infrared light beam is higher than or equal to 10%. Preferably, in the working light beam, the ratio of the visible light beam to the near infrared light beam ranges from 11% to 25%. In other words, the light emitting diode structure of the present disclosure can generate a great amount of the near infrared light beam to be used as a near infrared light source and a slight amount of the visible light beam for indication or location purposes.

Referring to results in Examples 1 to 3, the color temperature of the working light beam ranges from 2900K to 3500K, and the ratio of the visible light beam to the near infrared light beam is higher than or equal to 11%.

Referring to results in Examples 4 to 6, the color temperature of the working light beam ranges from 3500K to 3800K, and the ratio of the visible light beam to the near infrared light beam is higher than or equal to 20%. Compared to Examples 1 to 3, the red phosphor layer (Examples 4 to 6) can greatly enhance the power of the visible light in the working light beam.

Referring to results in Examples 7 to 9, the color temperature of the working light beam ranges from 2500K to 2700K, and the ratio of the visible light beam to the near infrared light beam is higher than or equal to 13%. Compared to Examples 1 to 3, the red LED chip (Examples 7 to 9) can enhance the ratio of the visible light beam to the near infrared light beam in the working light beam.

Figure 10:
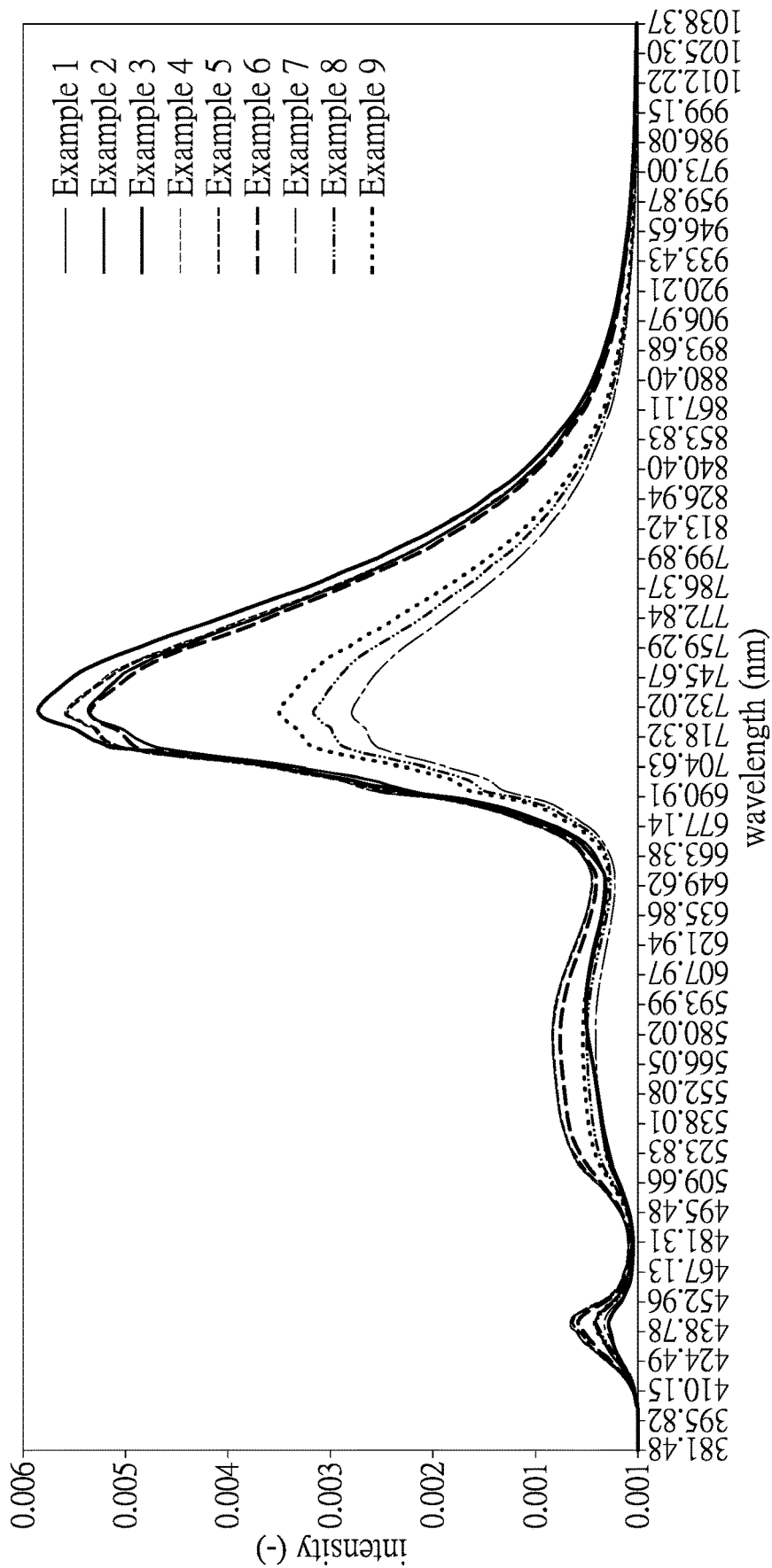
FIG. 10 is a light spectrum of the light emitting diode structure of Examples 1 to 9 of the present disclosure.

In addition, FIG. 10 is a spectrum of the light emitting diode structure of Examples 1 to 9. Referring to FIG. 10, the light emitting diode structure of the present disclosure can generate the visible light beam and the near infrared light beam simultaneously. Users can choose the light emitting diode structures of different structural configurations (the first embodiment to the ninth embodiment) according to different requirements.

Method for Manufacturing Light Emitting Diode Structure

Figure 11:
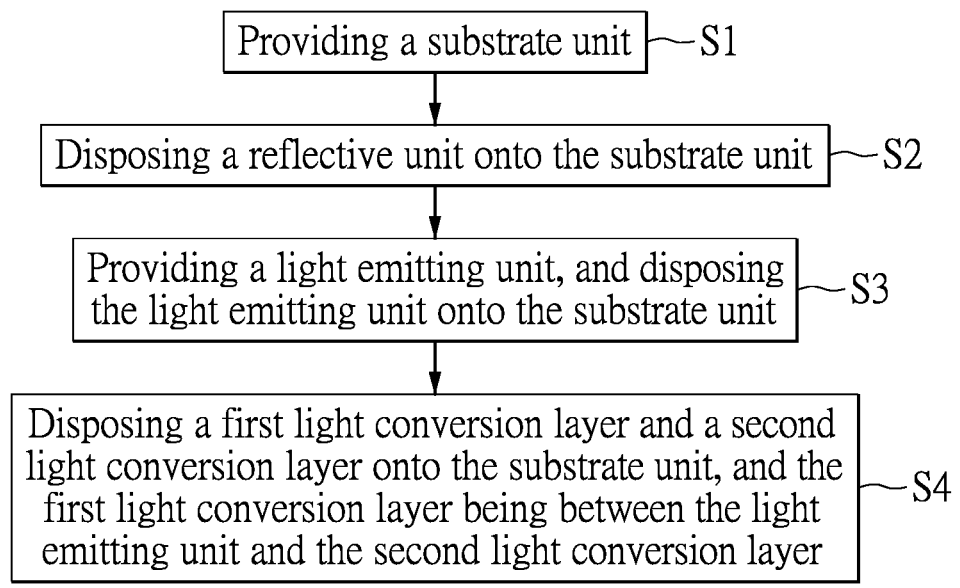
FIG. 11 is a flowchart of a method for manufacturing the light emitting diode structure of the present disclosure.

Referring to FIG. 11, a method for manufacturing the light emitting diode structure includes steps below. A substrate unit is provided (step S1). A reflective unit is disposed onto the substrate unit (step S2). A light emitting unit is provided and is disposed onto the substrate unit (step S3). The light emitting unit includes a blue LED chip and is used to generate the first light beam. The first light conversion layer and the second light conversion layer are disposed onto the light emitting unit, and the first light conversion layer is disposed between the light emitting unit and the second light conversion layer (step S4). A part of the first light beam is converted into the second light beam by the first light conversion layer. Another part of the first light beam is converted into the third light beam by the second light conversion layer.

Beneficial Effects of the Embodiments

In conclusion, the light emitting diode structure of the present disclosure, by virtue of the technical features of "a first light conversion layer to convert a part of the first light beam into a second light beam" and "a second light conversion layer to convert another part of the first light beam into a third light beam", enables the light emitting diode structure to have necessary properties in application.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting diode (LED) structure, comprising:
a light emitting unit including a blue LED chip to generate a first light beam;
a first light conversion layer disposed on the light emitting unit to convert a part of the first light beam into a second light beam; and
a second light conversion layer disposed on the first light conversion layer to convert another part of the first light beam into a third light beam;
wherein a remaining part of the first light beam, the second light beam, and the third light beam are superposed to form a working light beam, a spectrum of the working light beam includes a first wave band ranging from 350 nm to 660 nm and a second wave band ranging from 660 nm to 1000 nm, and a power of the working light beam in the second wave band is higher than a power of the working light beam in the first wave band.

2. The light emitting diode structure according to claim 1, wherein a ratio of the power of the working light beam in the first wave band to the power of the working light beam in the second wave band is larger than 10%.

3. The light emitting diode structure according to claim 1, wherein a color temperature of the working light beam ranges from 2000 K to 3800 K.

4. The light emitting diode structure according to claim 1, wherein the first light conversion layer contains a near infrared light phosphor, and the near infrared light phosphor is selected from the group consisting of: $(Y, Lu, Gd)_3(Ga, Al, Sc)_5O_{12}:Cr$, $(Y, Lu, Gd)_3(Ga, Al, Sc)_5O_{12}:Yb$, $(Li, Na, K)(B, Ga, Al)_5(Mg, Ca, Sr, Ba, Zn)O_8:Cr$, $(Li, Na, K, Rb, Cs, NH_4)_3(Al, Ga)F_6:Cr$, and $(Sc)BO_3:Cr$.

5. The light emitting diode structure according to claim 4, wherein a fluorescence emission spectrum of the near infrared light phosphor has a peak between 700 nm and 1800 nm.

6. The light emitting diode structure according to claim 1, wherein, based on a total weight of a light-transmissive resin of the first light conversion layer being 100 phr, the first light conversion layer contains 200 phr to 400 phr of a near infrared light phosphor.

7. The light emitting diode structure according to claim 1, wherein, based on a total weight of a light-transmissive resin of the first light conversion layer being 100 phr, the first light conversion layer contains 1 phr to 10 phr of a red phosphor.

8. The light emitting diode structure according to claim 1, wherein the second light conversion layer contains a visible light phosphor, and the visible light phosphor is selected from the group consisting of: $(Y, Lu, Gd, Tb)_3(Ga, Al)_5O_{12}:Ce$, $(La, Y)_3Si_6N_{11}:Ce$, $(Sr, Ba, Mg)_2SiO_4:Eu$, $(Ba, Ca, Sr)Si_2O_2N_2:Eu$, $\alpha$-SiAlON:Eu, $\beta$-SiAlON:Eu, $(Sr, Ca)_2Si_5N_8:Eu$, $NaCa_2Al_{13}O_{22}:Eu$, $K_6Ba_4B_8O_{19}:Eu$, $Ba_5B_4O_{10}F_2:Eu$, and $(Sr, Ca)AlSiN_3:Eu$.

9. The light emitting diode structure according to claim 1, wherein, based on a total weight of a light-transmissive resin of the second light conversion layer being 100 phr, the second light conversion layer contains 5 phr to 70 phr of a visible light phosphor.

10. The light emitting diode structure according to claim 1, wherein the second light conversion layer contains a visible light phosphor, and the visible light phosphor includes a red phosphor and a yellow phosphor.

11. The light emitting diode structure according to claim 10, wherein, based on the total weight of the light-transmissive resin of the second light conversion layer being 100 phr, the second light conversion layer contains 5 phr to 60 phr of the yellow phosphor and 1 phr to 10 phr of the red phosphor.

12. The light emitting diode structure according to claim 1, wherein a red phosphor layer is disposed between the blue LED chip and the first light conversion layer.

13. The light emitting diode structure according to claim 12, wherein the red phosphor layer contains a red phosphor selected from the group consisting of $(Sr, Ca)AlSiN_3:Eu$, $(Sr, Ca)_2Si_5N_8:Eu$, $NaCa_2Al_{13}O_{22}:Eu$, $K_6Ba_4B_8O_{19}:Eu$, and $Ba_5B_4O_{10}F_2:Eu$.

14. The light emitting diode structure according to claim 12, wherein, based on a total weight of a light-transmissive resin of the red phosphor layer being 100 phr, the red phosphor layer contains 1 phr to 50 phr of a red phosphor.

15. The light emitting diode structure according to claim 1, wherein the light emitting unit includes a red LED chip, and a red light beam generated by the red LED chip and a blue light beam generated by the blue LED chip are superposed to form the first light beam.

16. The light emitting diode structure according to claim 1, wherein the light emitting diode structure further includes a light-transmissive layer, and a material of the light-transmissive layer includes a silicone-based composition, an epoxy composition, or a mixture thereof.

17. The light emitting diode structure according to claim 16, wherein the light-transmissive layer is disposed between the light emitting unit and the first light conversion layer.

18. The light emitting diode structure according to claim 17, wherein a refractive index of the light-transmissive layer is higher than or equal to a refractive index of the first light conversion layer, and the refractive index of the first light conversion layer is higher than or equal to a refractive index of the second light conversion layer.

19. The light emitting diode structure according to claim 16, wherein the light-transmissive layer is disposed between the first light conversion layer and the second light conversion layer.

20. The light emitting diode structure according to claim 19, wherein a refractive index of the first light conversion layer is higher than or equal to a refractive index of the light-transmissive layer, and the refractive index of the light-transmissive layer is higher than or equal to a refractive index of the second light conversion layer.

21. The light emitting diode structure according to claim 1, wherein a refractive index of the first light conversion layer is higher than or equal to a refractive index of the second light conversion layer.

\* \* \* \* \*